United States Patent [19]

Possley et al.

[11] 4,101,350
[45] Jul. 18, 1978

[54] SELF-ALIGNED EPITAXIAL METHOD FOR THE FABRICATION OF SEMICONDUCTOR DEVICES

[75] Inventors: Glen G. Possley, Sugarland; Robert G. Massey, Sherman; Billy B. Williams, Richardson, all of Tex.

[73] Assignee: Texas Instruments Incorporated, Dallas, Tex.

[21] Appl. No.: 735,725

[22] Filed: Oct. 26, 1976

Related U.S. Application Data

[63] Continuation of Ser. No. 556,037, Mar. 6, 1975, abandoned.

[51] Int. Cl.² .................... H01L 21/20; H01L 21/76
[52] U.S. Cl. ......................... 148/175; 29/576 R; 29/576 W; 29/577 R; 29/570; 148/187; 357/50; 357/52
[58] Field of Search .............. 148/175, 187; 357/50, 357/52; 29/576-578

[56] References Cited

U.S. PATENT DOCUMENTS

| 3,206,339 | 9/1965 | Thornton | 148/175 |
| 3,386,865 | 6/1968 | Doo | 148/175 |
| 3,748,545 | 7/1973 | Beale | 148/175 X |
| 3,753,803 | 8/1973 | Nomura et al. | 148/175 |
| 3,861,968 | 1/1975 | Magdo et al. | 148/175 |
| 3,998,673 | 12/1976 | Chow | 148/175 |

FOREIGN PATENT DOCUMENTS 2,104,776  8/1971  Fed. Rep. of Germany ....... 148/175

*Primary Examiner*—L. Dewayne Rutledge
*Assistant Examiner*—W. G. Saba
*Attorney, Agent, or Firm*—James T. Comfort; Gary C. Honeycutt

[57] ABSTRACT

In the fabrication of semiconductor devices, a method is provided which includes the steps of selectively doping a semiconductor substrate of one conductivity type to form therein discrete regions of opposite conductivity type, followed by selective epitaxial growth to fill the windows of the diffusion mask, whereby the epitaxially grown regions are inherently characterized by exact alignment with the doped regions. The self-aligned epitaxial structure is then subjected to further processing in accordance with numerous alternate schemes to provide a wide variety of devices.

5 Claims, 7 Drawing Figures

SELF-ALIGNED EPITAXIAL METHOD FOR THE FABRICATION OF SEMICONDUCTOR DEVICES

This is a continuation of application Ser. No. 556,037, filed Mar. 6, 1975, now abandoned.

This invention relates to the fabrication of semiconductor devices; and more particularly, to a method of providing an epitaxial substrate characterized by a combination of dielectric and p-n junction isolation wherein selectively grown epitaxial regions are self-aligned with selectively doped substrate regions.

Repeated advances have been made in the fabrication of semiconductor devices and integrated circuits, with a persistent view toward cost reductions and increased component densities. A primary object of the present invention is to provide a simpler and less expensive method for the fabrication of high-density integrated circuit structures characterized by a combination of dielectric and p-n junction isolation.

In accordance with one embodiment of the invention, an apertured mask is formed on a semiconductor substrate of one conductivity type, followed by the step of selectively doping the substrate by diffusing or implanting impurities therein through one or more apertures in the mask. Subsequently, using the same mask, epitaxial growth is initiated at the aperture locations to provide epitaxial regions inherently characterized by exact alignment with the selectively diffused or implanted regions previously formed in the substrate at the aperture locations.

In a preferred embodiment, the process of the invention begins with the growth of a silicon oxide layer on the surface of a p-type silicon substrate having a crystallographic orientation selected to favor epitaxial growth. For example, a resistivity of 5 to 20 ohm-centimeters, and a (100) orientation are selected.

The oxide layer, grown to a suitable thickness, preferably about 2 microns, is then patterned to provide one or more apertures at locations selected for device fabrication. Heavily doped regions of n-type conductivity are then formed at the aperture locations by known techniques, preferably by ion implantation.

Subsequently, with the original mask in place, the slice is prepared for selective epitaxial growth, such as by de-glazing to remove any surface film that may have formed in the oxide windows during implantation or diffusion. Preferred conditions for epitaxial growth include a reaction gas composed of silicon tetrachloride in a hydrogen carrier, and arsine in amounts sufficient to provide the epitaxial deposits with n-type conductivity.

One skilled in the art will recognize that the resulting n+/n geometry is suitable for further processing to fabricate n-p-n transistors using known techniques.

The preferred embodiment is further improved by first diffusing or implanting a p-type "channel stop" layer across the entire surface of the substrate to prevent channel inversion leakage between adjacent n+ regions of the completed structure.

Figure 1:
FIGS. 1 through 6 are cross-sectional views of a semiconductor wafer, showing the various sequential stages of fabrication in accordance with the invention.

Substrate 11 of FIG. 1 is p-type monocrystalline silicon having a crystallographic orientaion of (100) and a resistivity of 10 to 15 ohm-centimeters. Other crystallographic orientations are also useful in accordance with the invention, and other resistivities as well.

In this embodiment the first step of the process is the deposition of boron, for example, or other p-type dopant film 12 which, upon subsequent diffusion, will form a "channel stop" layer to prevent inversion leakage between devices, as will readily be appreciated by one skilled in the art.

Figure 2:
Figure 3:
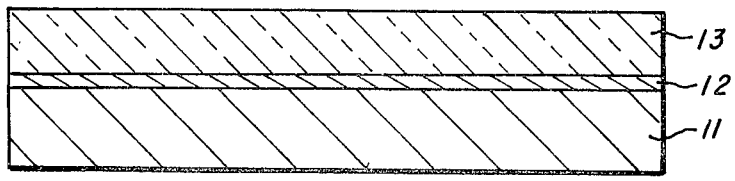

As shown in FIG. 3, the slice of FIG. 2 is then subjected to thermal oxidation to cause a simultaneous growth of silicon dioxide and to complete the channel stop diffusion, whereby an oxide layer is grown to a thickness of preferably about 2 microns. Channel stop layer 12 has a resistivity of about 0.1 ohm-centimeters or less.

Figure 4:
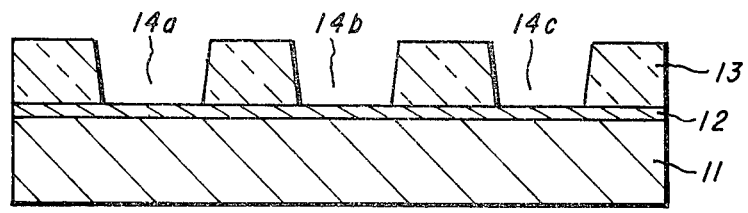

Next, as shown in FIG. 4, oxide layer 13 is patterned by known photolithographic techniques to provide apertures 14a, 14b, and 14c at locations where device fabrication is to be completed.

Figure 5:
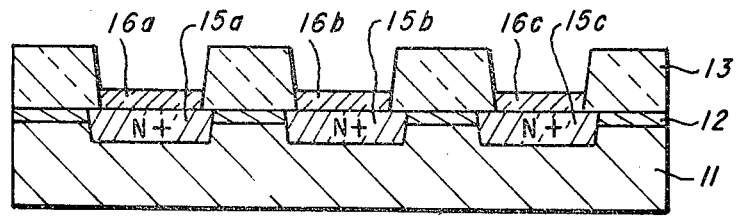

In FIG. 5, the slice of FIG. 4 is shown after selective diffusion or implantation of arsenic/antimony, for example, to form regions 15 of n+ conductivity. Regions 15a, b, and c have a sheet resistance of about 10 ohms per square, for example.

Figure 6:
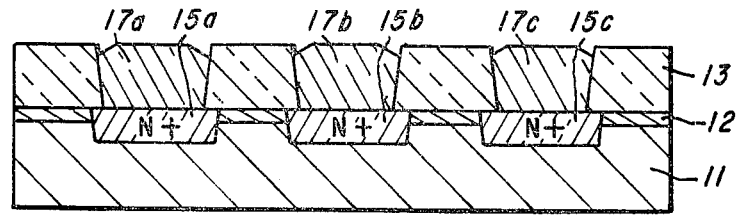

In FIG. 6, the wafer is shown after selective epitaxial growth to form regions 17. In this embodiment, the epitaxial growth is conducted in two stages so as to provide region 17a and 17b of n-type conductivity while aperture 14c is masked, followed subsequently by the growth of a p-type region 17c while region 17a and b are selectively masked. Epitaxial growth conditions must be optimized so as to minimize spurious deposition of polycrystalline silicon on oxide 13.

It will be recognized that selective epitaxial growth is a sensitive process, optimum conditions for which depend upon various parameters, including the ratio of the area of exposed silicon to the area of mask surface, the mask thickness and mask composition. When using an oxide mask, preferred epi growth conditions generally include a gas composition of about 0.1 mol % $SiCl_4$ in hydrogen, and a growth temperature of 1025–1050° C. These conditions are not critical to the process or concept of the invention, however, since one skilled in the art can readily develop other suitable conditions.

Silicon nitride is also a suitable mask material, and will require somewhat different epi growth conditions for best results, as readily appreciated by those skilled in the art.

Figure 7:
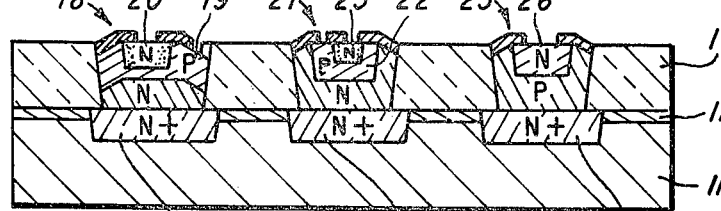
FIG. 7 is a cross-sectional view of the semiconductor wafer showing a structure completed in accordance with one embodiment of the invention.

Subsequently, as shown in FIG. 7, regions 17a through c are subjected to further processing in accordance with known techniques to provide a variety of devices, including transistor 18 formed by nonselective diffusion to form base region 19, followed by selective diffusion of emitter region 20 and corresponding metallization.

Transistor 21 is formed by selective diffusion of base region 22 and selective diffusion of emitter region 23 to which standard metallization is applied.

Diode 25 is formed by a single step of selective diffusion to form n-type region 26, which is then metallized using known techniques.

The method of the invention provides a significant cost reduction because of its simplicity, and also provides increased packing density compared to standard techniques. The illustrated embodiment of the invention can further be improved by one additional masking step to provide selective deposition of the channel stop dopant, whereby the window locations 14a through c will be free of the channel stop dopant, thereby minimizing any tendency such dopant may have to interfere with the subsequent diffusion or implantation of regions 15a through c, and the subsequent growth of epitaxial film 17.

Still further improvement may be obtained by the use of ion implantation to form regions 15a through c, intead of diffusion, whereby surface damage to the substrate may be avoided or minimized, which will, in turn, maximize the yield of defect-free epideposits. It will be appreciated by those skilled in the art that epitaxial film 17 in windows 14 is initiated totally from a single substrate plane, and hence does not suffer the adverse effects of multi-plane growth as is true for etch and re-fill processes characterized by the formation and re-fill of pockets in a semiconductor substrate.

The structure of FIG. 6 is also useful to fabricate devices other than those shown in FIG. 7, including, for example, epitaxial diodes, microwave transistors, junction field effect transistors, MOS field-effect transistors of both the p-channel and n-channel types; further including complementary MOS devices. Bipolar integrated circuits including the TTL, the Schottky TTL, ECL, and I²L are also readily fabricated in the basic structure of FIG. 6.

What is claimed is:

1. A method for the fabrication of a semiconductor device comprising the steps of:

preparing a moncrystalline silicon substrate of one conductivity type having a crystallographic surface orientation of (100), a resistivity of 10 to 15 ohm-centimeters, and a thin surface layer thereon of the same conductivity type, said surface layer extending across the entire substrate surface and having a resistivity of about 0.1 ohm-centimeter or less;

forming an apertured diffusion or implantation mask on said substrate;

selectively placing impurities of the opposite conductivity type in said substrate through at least one aperture in said mask to a depth greater than the thickness of said surface layer, and with a dosage sufficient to convert the affected portion of said surface layer to said opposite conductivity type; and thereafter, using the same mask and the same aperture, selectively growing epitaxial monocrystalline silicon in said aperture, to a thickness substantially the same as the thickness of said mask, whereby the resulting epitaxial region is inherently aligned with the region in said substrate formed by said step of selectively placing impurities in said substrate through said aperture, and whereby the mask and the epitaxial layer exhibit a substantially coplanar surface for subsequent processing.

2. A method as in claim 1 further including the steps of:

forming an apertured mask on the surface of said epitaxially grown region; and selectively passing impurities through at least one aperture in said mask to form a doped region in said epitaxially grown region.

3. A method as in claim 2 wherein the original substrate is of p-type conductivity; said diffused region in the substrate is of n+ conductivity type; said epitaxially grown region is of p-type conductivity; and said diffused region formed in said epitaxially grown region is of n-type conductivity.

4. A method as in claim 2 wherein said substrate is of p-type conductivity, said first diffused region is of n+ conductivity, said epitaxially grown region is of n-type conductivity, said region diffused in said epitaxially grown region is of p-type conductivity, and further including the step of selectively diffusing another region of n-type conductivity within said diffused region of p-type conductivity; followed by the step of selective metallization to said regions to form an n-p-n bipolar transistor.

5. A method as in claim 2 wherein said substrate is of p-type conductivity, said first diffused region is of n+ conductivity, said epitaxially grown region is of p-type conductivity, said region diffused in said epitaxially grown region is of n-type conductivity, followed by the step of selective metallization to said regions to form an n-p-n- bipolar transistor.

* * * * *